US009070419B1

(12) United States Patent
Zhu et al.

(10) Patent No.: US 9,070,419 B1
(45) Date of Patent: Jun. 30, 2015

(54) ELECTRONIC APPARATUS WITH FIRST AND SECOND SLIDING TRAY MODULES

(71) Applicants: Inventec (Pudong) Technology Corporation, Shanghai (CN); INVENTEC CORPORATION, Taipei (TW)

(72) Inventors: Fonly Zhu, Shanghai (CN); Ping-Wei Peng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/609,413

(22) Filed: Jan. 29, 2015

(30) Foreign Application Priority Data

Dec. 4, 2014 (CN) .......................... 2014 1 0729532

(51) Int. Cl.
 *G11B 33/12* (2006.01)
 *H05K 7/14* (2006.01)
 *G06F 1/18* (2006.01)
(52) U.S. Cl.
 CPC .............. *G11B 33/128* (2013.01); *G06F 1/187* (2013.01); *H05K 7/1491* (2013.01)
(58) Field of Classification Search
 USPC ............. 360/92.1; 720/615; 361/695, 679.49, 361/694, 825, 826, 827, 679.33
 See application file for complete search history.

(56) References Cited

U.S. PATENT DOCUMENTS

| | | | | |
|---|---|---|---|---|
| 4,392,344 A * | 7/1983 | Gordon et al. | .................. | 59/78.1 |
| 4,907,889 A * | 3/1990 | Simone | ........................ | 360/92.1 |
| 6,435,354 B1 * | 8/2002 | Gray et al. | ...................... | 211/26 |
| 6,600,665 B2 * | 7/2003 | Lauchner | ...................... | 361/826 |
| 6,787,702 B2 * | 9/2004 | Suzuki | ........................ | 174/72 A |
| 6,896,344 B2 * | 5/2005 | Tsutsumi et al. | ........... | 312/330.1 |
| 6,940,019 B2 * | 9/2005 | Ikeda et al. | .................. | 174/68.3 |
| 6,996,967 B2 * | 2/2006 | Kobayashi | ..................... | 59/78.1 |
| 7,009,112 B1 * | 3/2006 | Mead et al. | ..................... | 174/69 |
| 7,082,720 B2 * | 8/2006 | Kobayashi et al. | ............. | 49/360 |
| 7,189,924 B1 * | 3/2007 | Popescu et al. | ................. | 174/69 |
| 7,552,581 B1 * | 6/2009 | Pfeifer et al. | ................... | 59/78.1 |
| 7,984,605 B2 * | 7/2011 | Pfeifer et al. | ................... | 59/78.1 |
| 8,379,410 B2 * | 2/2013 | Kitten | .......................... | 361/826 |
| 8,549,831 B2 * | 10/2013 | Dunham et al. | ................. | 59/78.1 |
| 2004/0079711 A1 * | 4/2004 | Hartman et al. | ................ | 211/26 |

(Continued)

FOREIGN PATENT DOCUMENTS

TW M441186 11/2012

*Primary Examiner* — Brian Miller
(74) *Attorney, Agent, or Firm* — CKC & Partners Co., Ltd.

(57) ABSTRACT

An electronic device includes a chassis, first and second sliding tray modules, first and second cables, and first and second cable-protecting members. The chassis includes a main sliding rail and has a bottom surface. The first and second sliding tray modules respectively contain a plurality of first and second storage modules. The first and second cables are respectively electrically connected to the first and second storage modules. The first cable-protecting member includes a plurality of first connecting units pivotally connected one by one. The first connecting units retain the first cable to move at a first height relative to the bottom surface. The second cable-protecting member includes a plurality of second connecting units pivotally connected one by one. The second connecting units retain the second cable to move at a second height relative to the bottom surface. The first height is different from the second height.

12 Claims, 5 Drawing Sheets

(56) References Cited

U.S. PATENT DOCUMENTS

2010/0123377 A1* 5/2010 Hsu ............................. 312/330.1
2012/0188725 A1* 7/2012 Masuda ........................ 361/724
2013/0120927 A1* 5/2013 Wen et al. ................ 361/679.39
2014/0055959 A1* 2/2014 Manda .......................... 361/728
2014/0204525 A1* 7/2014 Pecone et al. ............ 361/679.33

* cited by examiner

ELECTRONIC APPARATUS WITH FIRST AND SECOND SLIDING TRAY MODULES

BACKGROUND

Description of Related Art

A server needs to be simultaneously laden with hard disks, to increase the storage capacity of the information. The server includes a row of hard disks and a motherboard to control the row of hard disks. If the server requests to increase the storage capacity of the information, the server needs to add an additional row of hard disks. But after adding the additional row of hard disks to the server, due to the fact that the hard disk and the additional hard disks are too close in proximity to obstruct the maintenance of the server, so that repairing or substituting hard disks becomes increasing inconvenient. As for keeping a greater space between two rows of hard disks, leads to a greater space consuming from the server and therefore increases the cost of space.

Nowadays, some servers are equipped with the sliding trays for accommodating hard disks, to overcome the problem of consuming excessive space. Therefore, when a repairman slides the sliding tray in and out the server, cables also slide along with the sliding tray, so that cables are easily twisted with other cables or may get stuck.

Accordingly, producing an electronic device to solve the aforesaid problem is one of the valuable research projects among the industry.

SUMMARY

The present disclosure provides an electronic device includes a chassis, a first sliding tray module, a second sliding tray module, a first cable, a second cable, a first cable-protecting member, and a second cable-protecting member. The chassis includes a main sliding rail and has a bottom surface. The first sliding tray module includes a plurality of first storage modules. The first sliding tray module is slidably engaged to the main sliding rail, so that the first sliding tray module is able to selectively slide relative to the chassis along either a pull-out direction or an accommodating direction. The second sliding tray includes a plurality of second storage modules. The second sliding tray module is slidably engaged to the first sliding tray module, so that the second sliding tray module is able to selectively slide relative to the first sliding tray module along either the pull-out direction or the accommodating direction. The first cable electrically connects the first storage module. The second cable electrically connects the second storage module. The first cable-protecting member includes a plurality of first connecting units sequentially and pivotally connecting to each other. A pivotal axis of any of the first connecting units is substantially perpendicular to the bottom surface, so that each of the first connecting units has a first height relative to the bottom surface. When the first sliding tray module slides relative to the chassis, the first connecting units restrict the first sliding tray modules to slide at the first height. The second cable-protecting member includes a plurality of second connecting units, which are sequentially and pivotally connecting to each other. The pivotal axis of any of the second connecting units is substantially perpendicular to the bottom surface, so that each of the second connecting units has a second height relative to the bottom surface. When the second sliding tray module slides relative to the chassis, the second connecting units restrict the second sliding tray modules to slide at the second height. The first height is different from the second height.

According to an embodiment of the present disclosure, the first sliding tray module includes a first sliding rail. The first sliding rail is slidably engaged to the main sliding rail, so that the first sliding tray module is able to selectively slide relative to the chassis along either the pull-out direction or the accommodating direction.

According to an embodiment of the present disclosure, the second sliding tray module includes a second sliding rail. The second sliding rail is slidably engaged to the first sliding rail, so that the second sliding tray module is able to selectively slide relative to the first sliding tray module along either the pull-out direction or the accommodating direction.

According to an embodiment of the present disclosure, the chassis includes a side plate. The main sliding rail is disposed on an inner side of the side plate. The first sliding tray module can be propelled by the second sliding tray modules, and the first sliding tray module is able to selectively slide relative to the chassis to a first pull-out position along the pull-out direction or to a first accommodating position along the accommodating direction.

According to an embodiment of the present disclosure, when the first sliding tray module is located at the first pull-out position, the first sliding tray modules is aligned with an end edge of the side plate, and the second sliding tray module is located outside the chassis.

According to an embodiment of the present disclosure, when the first sliding tray module is located at the first accommodating position, the first sliding tray module and the second sliding tray module are inside the chassis and present a fully-received status.

According to an embodiment of the present disclosure, when the first sliding tray module is located at the first pull-out position, the second sliding tray module is able to selectively slide relative to the first sliding tray module to a second pull-out position along the pull-out direction or to a second accommodating position along the accommodating direction. When the first sliding tray module is located at the first pull-out position and the second sliding tray module is located at the second pull-out position, the first sliding tray module and the second sliding tray module present a fully-expanded status.

According to an embodiment of the present disclosure, each of the first storage modules has a longest length. When the first sliding tray module and the second sliding tray module present the fully-expanded status, a distance between the first sliding tray module and the second sliding tray module is greater than the longest length.

According to an embodiment of the present disclosure, the first sliding tray module has a plurality of storage grooves. The forming direction of every storage grooves is parallel to the pull-out direction. Each of the first storage modules is disposed inside the corresponding storage groove, and able to selectively slide out of the corresponding storage groove along the pull-out direction or insert into the corresponding storage groove along the accommodating direction.

According to an embodiment of the present disclosure, the second cable-protecting member further includes a rigid member. The rigid member is connected to the second sliding tray modules and able to slide along with the second sliding tray modules. The second cable-protecting member is bound inside the rigid member.

According to an embodiment of the present disclosure, the second connecting units are sequentially and pivotally connected to an end of the rigid members away from the second sliding tray module, and an end of the second connecting units away from the rigid members is fixed to the chassis.

According to an embodiment of the present disclosure, an end of the first cable-protecting member is connected to the first sliding tray module, and another end of the first cable-protecting member is fixed to the chassis.

Summarized from the above, the electronic device of the present disclosure respectively provides two cable-protecting members to bind and protect two separated cables, which are propelled to slide along with the first and second sliding tray modules respectively. Therefore, when the first and second sliding tray modules reciprocally slide relative to the chassis, two cables are prevented from being worn-out. In addition, each of the cable-protecting members includes a plurality of the connecting units which are sequentially and pivotally connected to each other, and the corresponding cable sequentially extends inside each of the pivotally-connected connecting unit. As a consequence, when the storage modules are propelled by the sliding tray modules to slide relative to the chassis, some connecting units of the cable-protecting member are able to rotate relative to each other, so as to draw the bound cables to slide together, to prevent the cables from self-twisted or getting stuck. Furthermore, two cable-protecting members are respectively restricted to slide at different heights relative to the bottom surface of the chassis, and therefore the present disclosure surely prevents two cables from twisting with each other or getting stuck, and also prevents the cables from interfering with other components inside the chassis.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
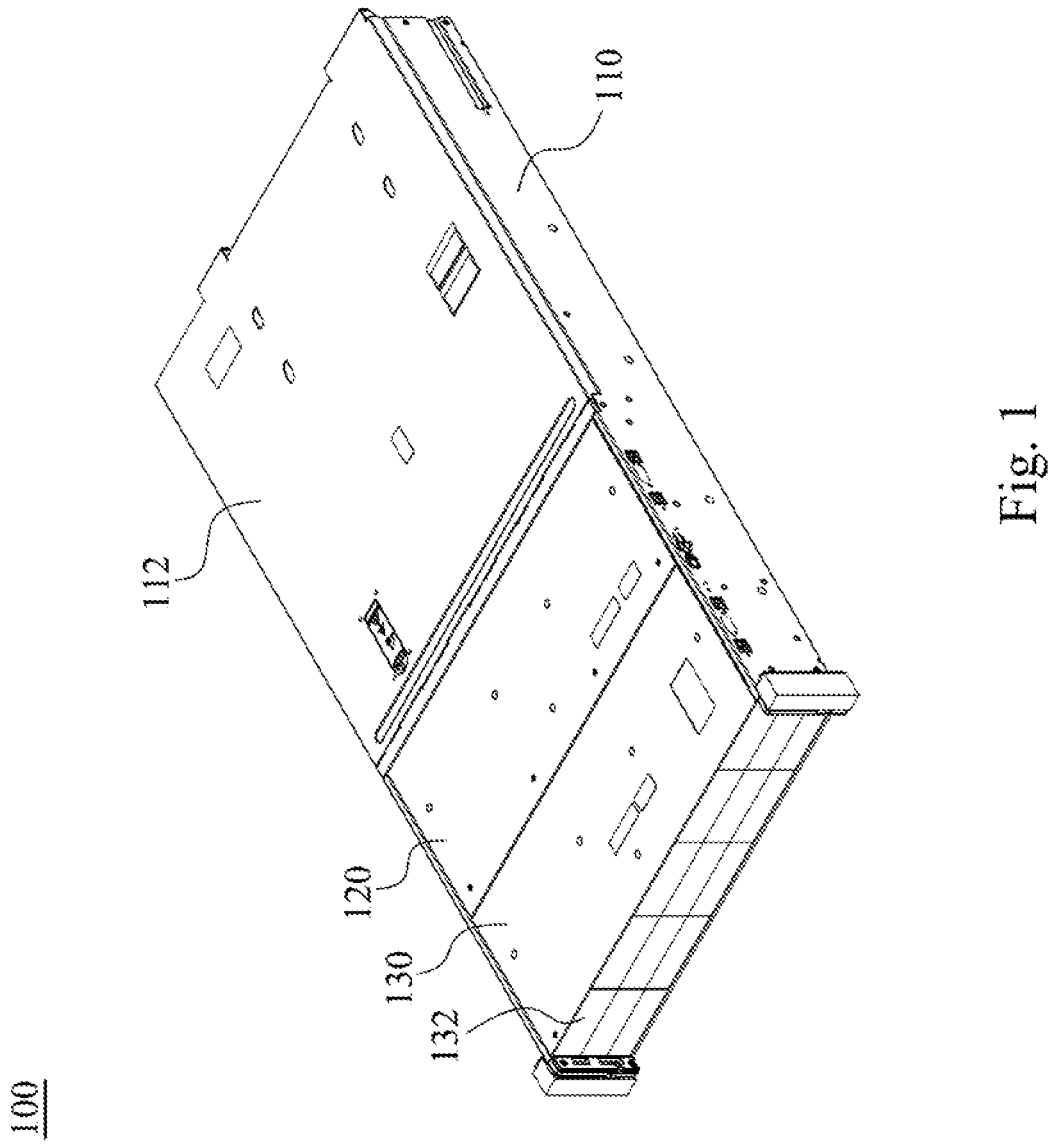
FIG. 1 is a perspective view of an electronic device according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

FIG. 1 illustrates a perspective view of an electronic device 100 according to an embodiment of the present disclosure. As shown in the FIG. 1, in the present embodiment, the electronic device 100 includes a chassis 110, a first sliding tray module 120, and a second sliding tray module 130. The chassis includes a top cap 112. An example of the electronic device is a server, but the disclosure is not limited in this regard.

Figure 2:
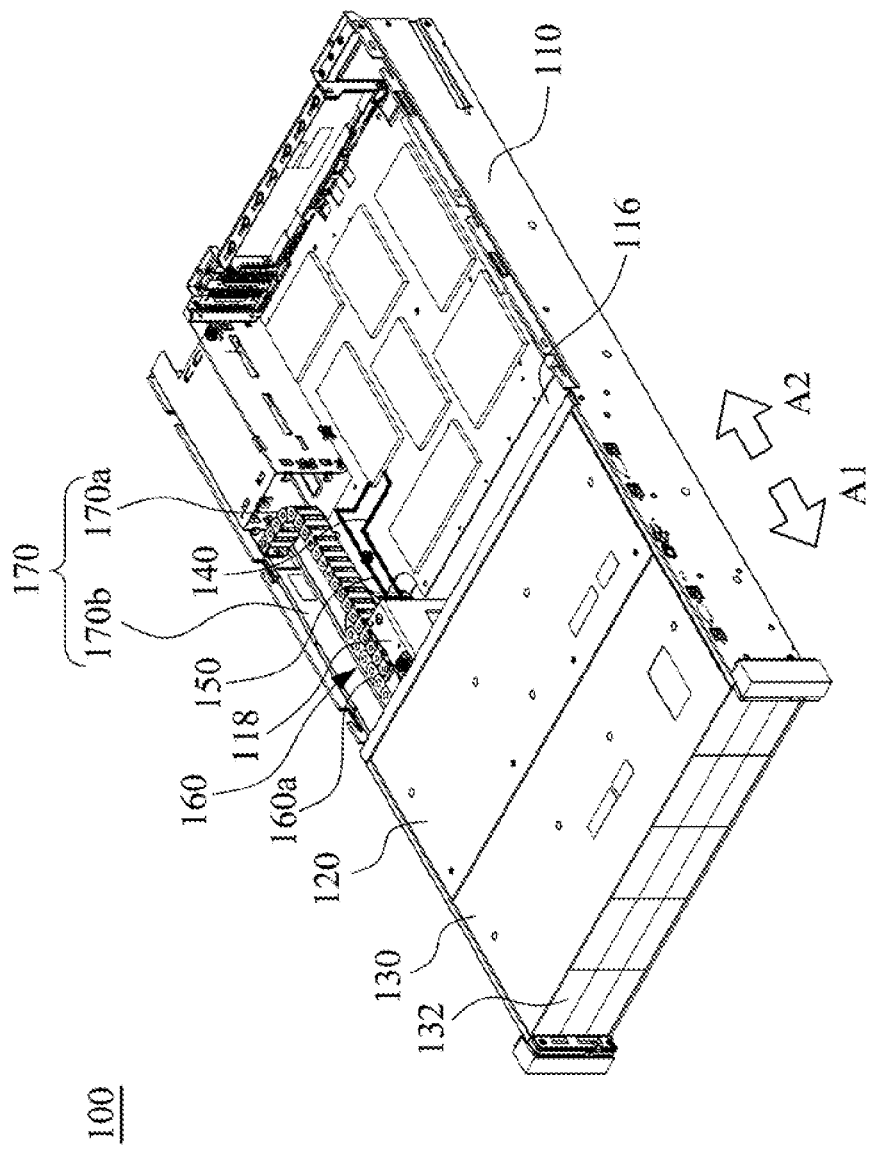
FIG. 2 is a perspective view of the electronic device in FIG. 1 without the top cap, in which the electronic device is presented a fully-received status of a first sliding tray module and a second sliding tray module.
Figure 3:
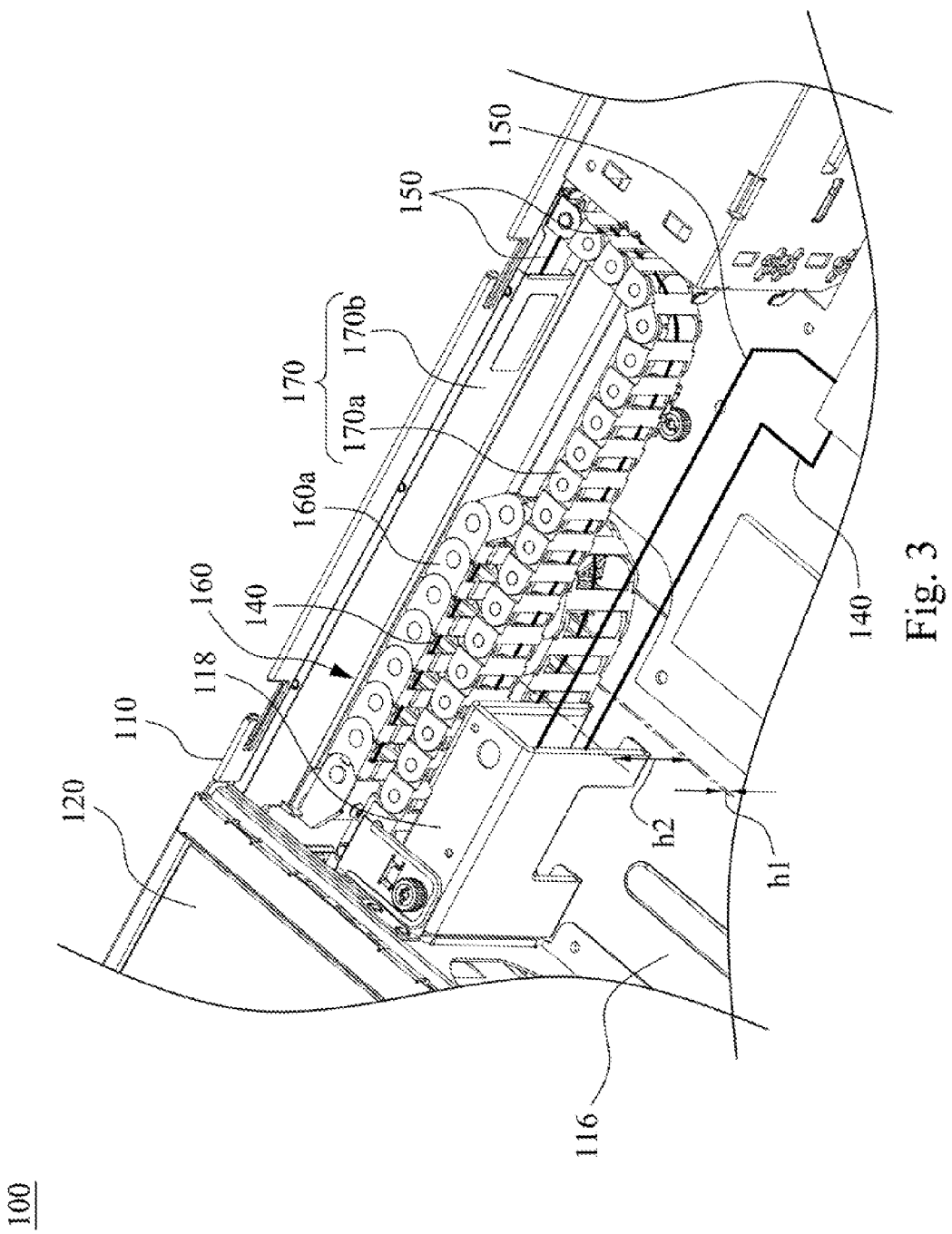
FIG. 3 is an enlarged view of the electronic device in FIG. 2 from another observation angle.
Figure 4:
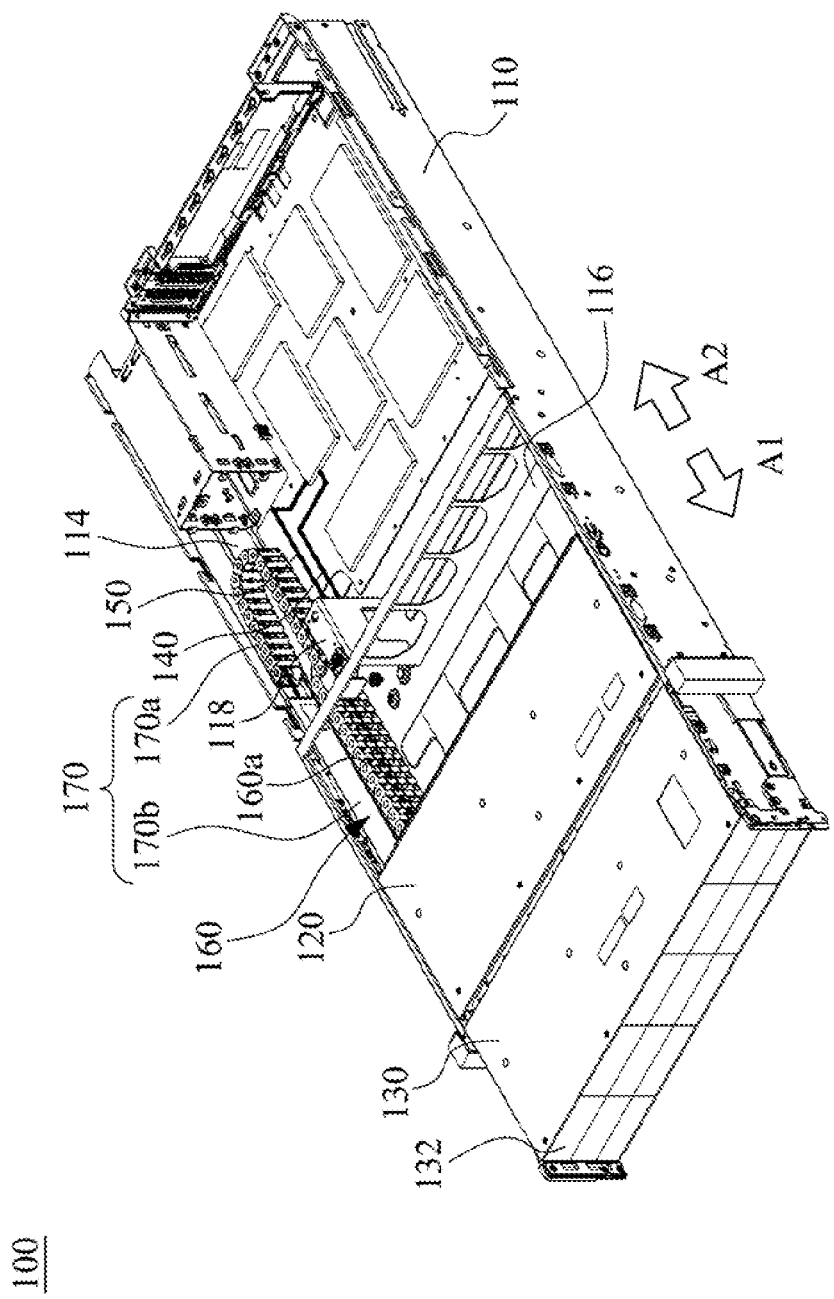
FIG. 4 is another perspective view of the electronic device in FIG. 2, in which the first sliding tray module is located at a first pull-out position and the second sliding tray module is located at a second accommodating position.
Figure 5:
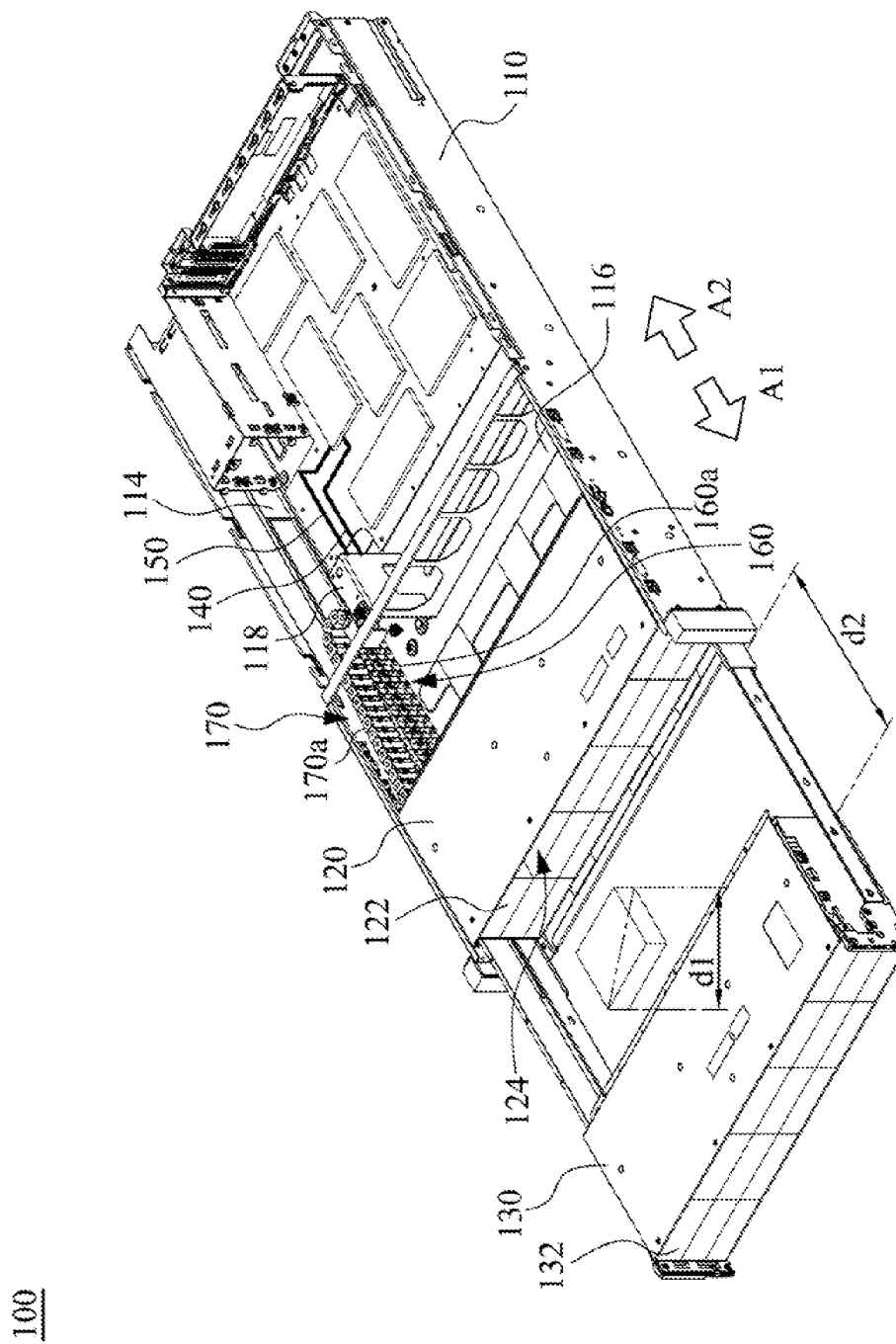
FIG. 5 is yet another perspective view of the electronic device in FIG. 2, in which the electronic device is presented a fully-expanded status of the first sliding tray module and the second sliding tray module.

FIG. 2 illustrates a perspective view of the electronic device 100 in FIG. 1 without the top cap 112, in which the electronic device 100 is presented in a fully-received status of the first sliding tray module 120 and the second sliding tray module 130. FIG. 3 illustrates an enlarged view of the electronic device 100 in FIG. 2 from another observation angle. FIG. 4 illustrates another perspective view of the electronic device 100 in FIG. 2, in which the first sliding tray module 120 is located at a first pull-out position and the second sliding tray module 130 is located at a second accommodating position. FIG. 5 illustrates yet another perspective view of the electronic device 100 in FIG. 2, in which the electronic device 100 is presented a fully-expanded status of the first sliding tray module 120 and the second sliding tray module 130.

As shown in FIGS. 2 to 5, in the present embodiment, the electronic device 100 further includes a first cable 140, a second cable 150, a first cable-protecting member 160, and a second cable-protecting member 170. The chassis 110 includes a main sliding rail 114 (as shown in FIG. 5) and has a bottom surface 116. The first sliding tray module 120 includes a plurality of first storage modules 122. The first sliding tray module 120 is slidably engaged to the main sliding rail 114, so that the first sliding tray module 120 is able to selectively slide relative to the chassis 110 along either a pull-out direction A1 or an accommodating direction A2. The second sliding tray 130 includes a plurality of second storage modules 132. The second sliding tray module 130 is slidably engaged to the first sliding tray module 120, so that the second sliding tray module 130 is able to selectively slide relative to the first sliding tray module 120 along either the pull-out direction A1 or the accommodating direction A2. That is, the slidable direction relative to the chassis 110 of the first sliding tray module 120 and the second sliding tray module 130 is parallel.

Furthermore, the first sliding tray module 120 includes a first sliding rail. The first sliding rail is slidably engaged to the main sliding rail 114, so that the first sliding tray module 120 is able to selectively slide relative to the chassis 110 along either the pull-out direction A1 or the accommodating direction A2. The second sliding tray module 130 includes a second sliding rail. The second sliding rail 130 is slidably engaged to the first sliding rail, and the second sliding tray module 130 is able to selectively slide relative to the first sliding tray module 120 along either the pull-out direction A1 or the accommodating direction A2.

More specifically, the chassis 110 includes a side plate. The main sliding rail 114 is disposed on an inner side of the side plate. The first sliding tray module 120 can be propelled by the second sliding tray modules 130, and the first sliding tray module 120 is able to selectively slide relative to the chassis 110 to a first pull-out position (as shown in FIGS. 4 and 5) along the pull-out direction A1 or to a first accommodating position (as shown in FIG. 2) along the accommodating direction A2. That is, when a repairman wants to make the first sliding tray module 120 slide to the first pull-out position, repairman can pull out the second sliding tray module 130 along the pull-out direction A1, and then the first sliding tray module 120 is propelled to the first pull-out position. Relatively speaking, when repairman wants to make the first sliding tray module 120 slide to the first accommodating position, repairman can push the second sliding tray module 130 along the accommodating direction A2, and then the first sliding tray module 120 is propelled to the first accommodating position.

In the present embodiment, when the first sliding tray module 120 is located at the first pull-out position, the first sliding tray modules 120 is aligned with an end edge of the side plate (as shown in FIGS. 4 and 5), and the second sliding tray module 130 is located outside the chassis 110. By means of aligning the first sliding tray module 120 located at the first pull-out position with the end edge of the side plate, repairman could easily disassemble or assemble the first storage module 122 disposed on the first sliding tray module 120 outside the chassis 110. Without stretching out into the chassis 110 to disassemble or assemble, convenience of repairing can be increased. However, the present disclosure is not intended to limit the alignment of the first sliding tray module 120 located at the first pull-out position and the end edge of the side plate to be exactly aligned. In practice, when the first sliding tray module 120 is located at the first pull-out position, the first sliding tray module 120 needs only to approximately align with the end edge of the side plate (with a tolerance), to have the aforesaid convenience of repairing.

In the present embodiment, when the first sliding tray module 120 is located at the first pull-out position, the second sliding tray module 130 is able to selectively slide relative to the first sliding tray module 120 to a second pull-out position (as shown in FIG. 5) along the pull-out direction A1 or to a second accommodating position (as shown in FIG. 4) along the accommodating direction A2. Also, when the first sliding tray module 120 is located at the first pull-out position and the second sliding tray module 130 is located at the second pull-out position, the first sliding tray module 120 and the second sliding tray module 130 present a fully-expanded status. Under the circumstances, even if pulling the second sliding tray module 130 along the pull-out direction A1, the first sliding tray module 120 and the second sliding tray module 130 become non-movable.

It is noted that, in the present embodiment, only if the first sliding tray module 120 is located at the first pull-out position, the second sliding tray module 130 can slide relative to the first sliding tray module 120. When the first sliding tray module 120 slides between the first pull-out location and the first accommodating location, the second sliding tray module 130 is restricted to be located at the second accommodating position relative to the first sliding tray module 120. (As shown in FIGS. 2 and 4, in which the second sliding tray module 130 abuts against the first sliding tray module 120) By means of restricting the operating mode, it is able to avoid unpredictable strike damaging the first storage module 122 or the second storage module 132 under process of either pulling out or accommodating the first sliding tray module 120 and the second sliding tray module 130.

Besides, when the first sliding tray module 120 is located at the first accommodating position and the second sliding tray module is located at the second accommodating position, the first sliding tray module 120 and the second sliding tray module are located inside the chassis and present a fully-received status (as shown in FIG. 2).

According to the above structural configuration, if repairman wants to substitute the first storage module 122 of the first sliding tray module 120, or repair the parts of the second sliding tray module 130 (not shown in Fig) adjacent to the first sliding tray module 120, the repairman only needs to make the first sliding tray module 120 and the second sliding tray module switch to the fully-expanded status (i.e., the first sliding tray module 120 is located at the first pull-out position and the second sliding tray module 130 is located at the second pull-out position). Then the repairman can easily do the required maintenance job.

Furthermore, the first sliding tray module 120 has a plurality of storage grooves 124. The forming direction of storage grooves 124 is parallel to the pull-out direction A1. Each of the first storage modules 122 is disposed inside the corresponding storage groove 124, and able to selectively slide out of the corresponding storage groove 124 along the pull-out direction A1 or insert into the corresponding storage groove 124 along the accommodating direction A2. Each of the first storage modules 122 has a longest length d1. (For example: the diagonal length of the first storage module 122 in FIG. 5) When the first sliding tray module 120 and the second sliding tray module 130 present the fully-expanded status, a distance d2 between the first sliding tray module 120 and the second sliding tray module 130 is greater than the longest length d1 of the storage module 122. So that during the first storage module 122 is either sliding out of the corresponding storage groove 124 along the pull-out direction A1 or inserting into the corresponding storage groove 124 along the accommodating direction A2, the space between the first sliding tray module 120 and the second sliding tray module 130 is sufficient for repairman to disassemble or assemble the first storage module 122.

Relatively speaking, if the repairman finishes either substituting the first storage module 122 of the first sliding tray module 120 or repairing the parts of the second sliding tray module 130 close to the first sliding tray module 120, the repairman needs only to make the first sliding tray module 120 and the second sliding tray module 130 present fully-received status, which means that the first sliding tray module 120 is located at the first accommodating position and the second sliding tray module 130 is located at the second accommodating position, and then repairman can storage the first sliding tray module 120 and the second sliding tray module 130 inside the chassis 110 as fully-received status.

As shown in FIGS. 2 to 5, in the present embodiment, an end of the first cable 140 can electrically connect the first storage module 122 through a back plate (not shown in drawing). A different end of the first cable 140 can electrically connect an inner electronic component of the electronic device 100. An end of the second cable 150 can electrically connect the second storage module 132 through another back plate (not shown in drawing). A different end of the second cable 150 also can electrically connect inner electronic component of the electronic device 100. The first cable-protecting member 160 includes a plurality of first connecting units 160a that are sequentially and pivotally connected. A pivotal axis of any of the first connecting units 160a are substantially perpendicular to the bottom surface 116 of the chassis 110, so that each of the first connecting units 160a has a first height h1 relative to the bottom surface 116 (as shown in FIG. 3). Two ends of the connected first connecting units 160a are respectively fixed at a fixture 118 disposed on the bottom surface 116 of the chassis 110 and the first sliding tray module 120. When the first sliding tray module 120 slides relative to the chassis 110, the first connecting units 160a restrict the first cable 140 to slide at the first height h1. Therefore, during the first storage module 122 is propelled by the first sliding tray module 120 to slide relative to the chassis 110, some first connecting units 160a of the first cable-protecting member 160 are able to rotate relative to each other, so as to draw the bound first cable 140 to slide together, so as to prevent the first cable 140 from becoming worn-out, self-twisted, or getting stuck.

The second cable-protecting member 170 includes a plurality of second connecting units 170a that are sequentially and pivotally connected. A pivotal axis of any of the second connecting units 170a are substantially perpendicular to the bottom surface 116 of the chassis 110, so that each of the second connecting units 170a has a second height h2 relative to the bottom surface 116 (as shown in FIG. 3). Two ends of the connected second connecting units 170a are respectively fixed at the chassis 110 and the second sliding tray module 130. When the second sliding tray module 130 slides relative to the chassis 110, the second connecting units 170a restrict the second cable 150 to slide at the second height h2. Therefore, during the second storage module 132 is propelled by the second sliding tray module 130 to slide relative to the chassis 110, some second connecting units 170a of the second cable-protecting member 170 are able to rotate relative to each other, so as to draw the bound second cable 140 to slide together, so as to prevent the second cable 140 from worn-out, self-twisted or getting stuck.

Furthermore, in the present embodiment, the first height h1 of every first connecting unit 160a relative to the bottom surface 116 is different with the second height h2 of every second connecting unit 170a relative to the bottom surface 116. Furthermore, the first cable-protecting member 160 and the second cable-protecting member 170 are respectively restricted to slide at different height relative to the bottom surface 116 of the chassis 110. Therefore, the present disclosure surely prevents the first cable 140 and the second cable 150 from twisting with each other or getting stuck, and also prevents the cables from interfering with other components inside the chassis 110.

In order to achieve solution of aforesaid problem preventing the first cable 140 and the second cable 150 from interacting with each other or with itself, and causing a twisting and/or stuck problem, in the present embodiment, every first connecting unit 160a and every second connecting unit 170a is hollow, so that the first cable 140 and the second cable 150 respectively extends inside each of pivotally-connected first connecting units 160a and second connecting units 170a.

In the present embodiment, as shown in FIGS. 2 to 5, the second cable-protecting member 170 further includes a rigid member 170b. The rigid member 170b is connected to the second sliding tray modules 130 and able to slide along with the second sliding tray modules 130. The rigid member 170b, which is long-string form and hollow inside, is practically disposed along the direction parallel to both the pull-out direction A1 and the accommodating direction A2. The second connecting units 170a are sequentially and pivotally connected to an end of the rigid members 170b away from the second sliding tray module 130. Another end of the second connecting units 170a away from the rigid members 170b is fixed to the chassis 110. The second cable 150 is bound inside the rigid member 170b and the second connecting units 170a. When the first sliding tray module 120 and the second sliding tray module 130 switch from the fully-received status to fully-expanded status, the traveled distance of the second sliding tray module 130 is greater than the traveled distance of the first sliding tray module 120. As a consequence, the length of the second cable 150 is also greater than the length of the first cable 140, so that the rigid member 170b is exactly the solution to prolong protecting length of the second cable 150

Summarized from the above, it is obvious that the electronic device of the present disclosure respectively provides two cable-protecting members to bind and protect two separated cables which are propelled to slide along with the first and second sliding tray module respectively. Therefore, when the first and second sliding tray modules reciprocally slide relative to the chassis, two cables are prevented from worn-out. In addition, each of the cable-protecting members includes a plurality of the connecting units, which are sequentially and pivotally connected to each other, and then the corresponding cable sequentially extends inside each of pivotally-connected connecting units. As a consequence, when the storage modules are propelled by the sliding tray modules to slide relative to the chassis, some connecting units of the cable-protecting member are able to rotate relative to each other, so as to draw the bound cables to slide together, to prevent the cables from becoming self-twisted or getting stuck. Furthermore, two cable-protecting members are respectively restricted to slide at different heights relative to the bottom surface of the chassis, and therefore the present disclosure surely prevents two cables from twisting with each other or getting stuck, and also prevents the cables from interfering with other components inside the chassis.

What is claimed is:

1. An electronic device comprising:
   a chassis comprising a main sliding rail and having a bottom surface;
   a first sliding tray module containing a plurality of first storage modules, wherein the first sliding tray module is slidably engaged to the main sliding rail, so as to selectively slide relative to the chassis along either a pull-out direction or an accommodating direction;
   a second sliding tray module containing a plurality of second storage modules, wherein the second sliding tray module is slidably engaged to the first sliding tray module, so as to selectively slide relative to the first sliding tray module along either the pull-out direction or the accommodating direction;
   a first cable electrically connecting the plurality of first storage modules;
   a second cable electrically connecting the plurality of second storage modules;
   a first cable-protecting member comprising a plurality of first connecting units sequentially and pivotally connecting, wherein a pivotal axis of the any of the first connecting units is substantially perpendicular to the bottom surface, so that each of the first connecting units has a first height relative to the bottom surface, and when the first sliding tray module slides relative to the chassis, the first connecting units restrict the first sliding tray module to slide at the first height; and
   a second cable-protecting member comprising a plurality of second connecting units pivotally connected, wherein a pivotal axis of any of the second connecting units is substantially perpendicular to the bottom surface, so that each of the second connecting units has a second height relative to the bottom surface, and when the second sliding tray module slides relative to the chassis, the second connecting units restrict the second sliding tray module to slide at the second height,
   wherein the first height is different from the second height.

2. The electronic device of claim 1, wherein the first sliding tray module comprises a first sliding rail, the first sliding rail is slidably engaged to the main sliding rail, so as to selectively slide relative to the chassis along either the pull-out direction or the accommodating direction.

3. The electronic device of claim 2, wherein the second sliding tray module comprises a second sliding rail, the second sliding rail is slidably engaged to the first sliding rail, so as to selectively slide relative to the first sliding tray module along either the pull-out direction or the accommodating direction.

4. The electronic device of claim 1, wherein the chassis comprises a side plate, the main sliding rail is disposed on an inner side of the side plate, the first sliding tray module can be propelled by the second sliding tray module, and the first sliding tray module is able to selectively slide relative to the chassis to a first pull-out position along the pull-out direction or to a first accommodating position along the accommodating direction.

5. The electronic device of claim 4, wherein when the first sliding tray module is located at the first pull-out position, the first sliding tray module is aligned with an end edge of the side plate, and the second sliding tray module is located outside the chassis.

6. The electronic device of claim 4, wherein when the first sliding tray module is located at the first accommodating position, the first sliding tray module and the second sliding tray module are accommodated inside the chassis and present a fully-received status.

7. The electronic device of claim 4, wherein when the first sliding tray module is located at the first pull-out position, the second sliding tray module is able to selectively slide relative to the first sliding tray module to a second pull-out position along the pull-out direction or to a second accommodating position along the accommodating direction, when the first sliding tray module is located at the first pull-out position and the second sliding tray module is located at the second pull-out position, the first sliding tray module and the second sliding tray module present a fully-expanded status.

8. The electronic device of claim 7, wherein each of the first storage modules has a longest length, when the first sliding tray module and the second sliding tray module present the fully-expanded status, a distance between the first sliding tray module and the second sliding tray module is greater than the longest length.

9. The electronic device of claim 1, wherein the first sliding tray module has a plurality of storage grooves, the forming direction of each of the storage grooves is parallel to the pull-out direction, each of the first storage modules is disposed inside the corresponding storage groove, and is able to selectively slide out of the corresponding storage groove along the pull-out direction or insert into the corresponding storage groove along the accommodating direction.

10. The electronic device of claim 1, wherein the second cable-protecting member further comprises a rigid member, the rigid member is connected to the second sliding tray module and able to selectively slide along with the second sliding tray module, and the second cable-protecting member is bound inside the rigid member.

11. The electronic device of claim 10, wherein the plurality of second connecting units and an end of the rigid members away from the second sliding tray module are sequentially and pivotally connected, and an end of the second connecting units away from the rigid members is fixed to the chassis.

12. The electronic device of claim 1, wherein an end of the first cable-protecting member is connected to the first sliding tray module, and another end of the first cable-protecting member is fixed to the chassis.

* * * * *